United States Patent
Koo et al.

(10) Patent No.: US 6,849,870 B2
(45) Date of Patent: Feb. 1, 2005

(54) ORGANIC GATE INSULATING FILM AND ORGANIC THIN FILM TRANSISTOR USING THE SAME

(75) Inventors: Bon Won Koo, Suwon-Shi (KR); In Sung Song, Daejeon-Shi (KR); In Seo Kee, Seongnam-Shi (KR); Hwan Jae Choi, Daejeon-Shi (KR); Eun Jeong Jeong, Daejeon-Shi (KR); In Nam Kang, Daejeon-Shi (KR)

(73) Assignee: Samsung Electronics Co., Ltd., Suwon-Shi (KR)

( * ) Notice: Subject to any disclaimer, the term of this patent is extended or adjusted under 35 U.S.C. 154(b) by 0 days.

(21) Appl. No.: 10/657,191

(22) Filed: Sep. 9, 2003

(65) Prior Publication Data

US 2004/0065929 A1 Apr. 8, 2004

(30) Foreign Application Priority Data

Sep. 28, 2002 (KR) .................. 10-2002-0059061

(51) Int. Cl.[7] .......................... H01L 35/24; H01L 51/00
(52) U.S. Cl. .................. 257/40; 257/410; 438/82; 438/99; 438/216; 438/261; 438/421; 438/591; 438/595
(58) Field of Search ................ 257/40, 410; 438/82, 438/99, 216, 261, 421, 591, 595

(56) References Cited

U.S. PATENT DOCUMENTS

| | | | | |
|---|---|---|---|---|
| 5,347,144 A | * | 9/1994 | Garnier et al. ............... | 257/40 |
| 5,912,473 A | * | 6/1999 | Wakita et al. ................ | 257/40 |
| 5,946,551 A | | 8/1999 | Dimitrakopoulos et al. | |
| 6,107,117 A | * | 8/2000 | Bao et al. ..................... | 438/99 |
| 6,207,472 B1 | * | 3/2001 | Callegari et al. ............. | 438/99 |
| 6,232,157 B1 | | 5/2001 | Dodabalapur et al. | |
| 6,344,660 B1 | * | 2/2002 | Dimitrakopoulos et al. .. | 257/40 |
| 6,344,662 B1 | * | 2/2002 | Dimitrakopoulos et al. .. | 257/40 |
| 6,635,508 B2 | * | 10/2003 | Arai et al. .................... | 438/99 |
| 6,777,529 B2 | * | 8/2004 | Ong et al. .................. | 528/373 |

* cited by examiner

*Primary Examiner*—Allan R. Wilson
*Assistant Examiner*—Edgardo Ortiz
(74) *Attorney, Agent, or Firm*—Birch, Stewart, Kolasch & Birch, LLP

(57) ABSTRACT

Disclosed is an organic gate insulating film and an organic thin film transistor using the same, in which a photo-alignment group is introduced into an organic insulating polymer, so that an organic active film has superior alignment, thereby increasing mobility. Further, the organic active film has a larger grain size, enhancing transistor characteristics.

6 Claims, 10 Drawing Sheets

ORGANIC GATE INSULATING FILM AND ORGANIC THIN FILM TRANSISTOR USING THE SAME

This nonprovisional applications claims priority under 35 U.S.C. § 119(a) on Patent Application No. 2002-59061 filed in Korea on Sep. 28, 2002, which is herein incorporated by reference.

BACKGROUND OF THE INVENTION

1. Field of the Invention

The present invention relates, in general, to organic gate insulating films and organic thin film transistors using the same. More specifically, the present invention is directed to an organic gate insulating film, capable of increasing the electrical characteristics of a transistor when used, and an organic thin film transistor having the insulating film.

2. Description of the Related Art

Ever since the development of polyacetylene, a conjugated organic polymer that exhibits semiconductor characteristics, there has been vigorous research on an organic semiconductor including polymer as semiconductor materials, which became one of novel electronic devices with many application in a variety of fields, such as functional electronic devices and optical devices. This is because, when used in the organic semiconductor, organic polymers show many advantages of having various synthetic routes, being easily formed into fiber- or film-shapes, showing excellent flexibility and good conductivity, being manufactured at lower costs, and so on.

As one of many devices prepared by using the organic conductive polymers, an organic thin film transistor (OTFT) characterized by using the organic polymer as an active film has been studied since the 1980s. In recent years, a lot of research on such an OTFT has been done all over the world. The OTFT is similar in a structure to the conventional Si-TFT, but it is different in a sense of using the organic polymer as a semiconductor material instead of Silicon. In the process of the OTFT, thin film of semiconductor layer can be fabricated by printing-process under atmospheric pressure, not by plasma-using chemical vapor deposition (CVD) which is very troublesome but essential for the formation of a Silicon thin film and, furthermore, a roll to roll process using a plastic substrate can be used so it is possible to manufacture a more inexpensive transistor.

At present, the organic thin film transistor has been applied for drive devices of active displays and plastic chips of smart cards or inventory tags. In the organic thin film transistor, its performance that is normally evaluated by field-effect mobility, flashing ratio and threshold voltage has been enhanced to be close to that of α-Si TFT. In addition, such performance of the organic thin film transistor depends on various factors, including a degree of crystallization of the organic active film, charge characteristics at the interface between a substrate and the organic active film, carrier injection capability of an interface between a source/drain electrode and the organic active film, etc. In this regard, a variety of methods have been proposed to improve its performance. In particular, with the aim of decreasing the threshold voltage, U.S. Pat. No. 5,946,551 disclosed a method of using dielectric materials having a high dielectric constant (i.e. High-K materials) for example ferroelectric insulating materials such as $Ba_xSr_{1-x}TiO_3$ (BST), $Ta_2O_5$, $Y_2O_3$, or $TiO_2$, and inorganic insulating materials, such as $PbZr_xTi_{1-x}O_3$ (PZT), $Bi_4Ti_3O_{12}$, $BaMgF_4$, $SrBi_2(Ta_{1-x}Nb_x)_2O_9$, $Ba(Zr_{1-x}Ti_x)O_3$ (BZT), $BaTiO_3$ or $SrTiO_3$. For the organic thin film transistor, a silicon oxide film and an inorganic insulating material can be used as the gate insulating film. But, when the inorganic oxide material being used, the OTFT has no advantage in terms of processing, compared with the conventional TFT using silicon as semiconductor materials.

Meanwhile, the organic insulating film used in the prior art is composed of polyimide, benzocyclobutene or photoacryl. However, such an organic insulating film has been found to be inferior to inorganic insulating films in light of transistor characteristics (U.S. Pat. No. 6,232,157). Thus, in order for an organic thin film transistor to be used practically, organic insulating materials that are suitable for a printing process and can contribute to good transistor characteristics when used in OTFT should be urgently developed.

SUMMARY OF THE INVENTION

Therefore, an object of the present invention is to solve the problems of the prior art and to provide an organic gate insulating film that provide good conditions for the formation of organic active film thereon and thus enable transistors including this insulating film to achieve the improvement on their properties.

Another object of the present invention is to provide an organic thin film transistor including the organic gate insulating film.

According to one aspect of the present invention to accomplish the above objects, there is provided an organic gate insulating film comprising an organic insulating polymer as represented by the following Formula 1:

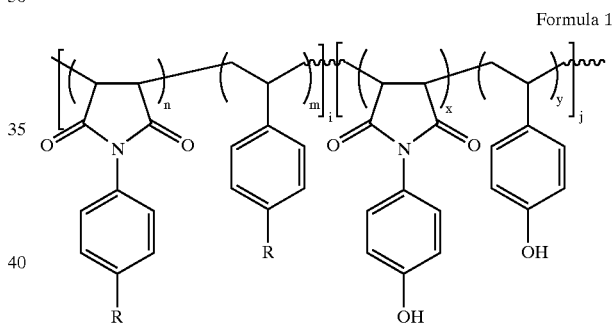

Formula 1

[Wherein, R is represented by the following Formula 2:

Formula 2

(Wherein, $R_1$ is selected from the following group I in which n is an integer of 0 to 10:

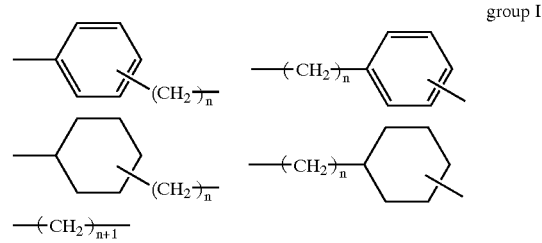

group I $R_2$ is a photo-alignment group selected from the groups II and III and, when 1 is 2 or more, at least one of $R_2$ is selected from the group II;

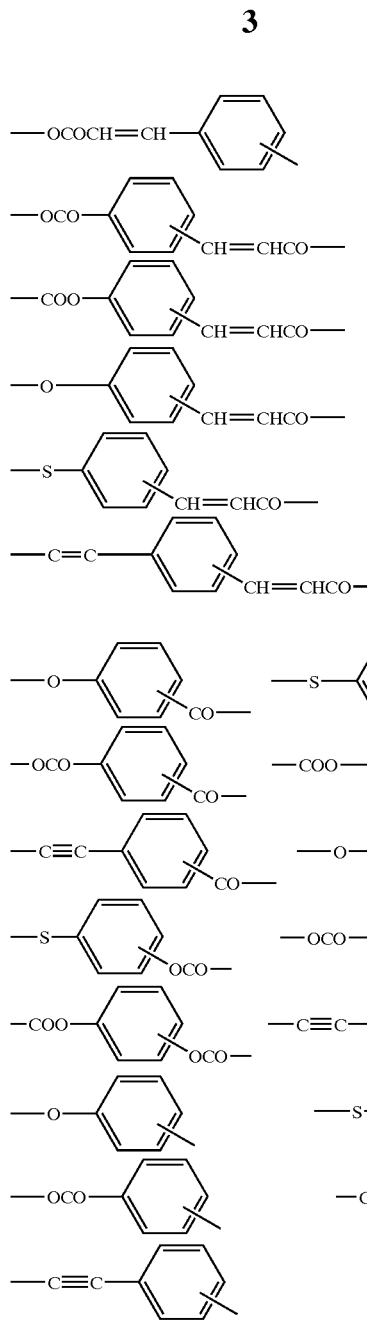

group II group III $R_3$ is a hydrogen atom or is selected from the group IV in which X shows a hydrogen atom, an alkyl or alkoxy group of 1 to 13 carbon atoms, an aromatic group of 6 to 20 carbon atoms, a heteroaromatic group of 4 to 14 carbon atoms having a heteroatom contained in an aromatic ring, $(OCH_2)_p CH_3$ (wherein p is an integer of 0 to 12), F, or Cl, and m is an integer of 0 to 18:

group IV

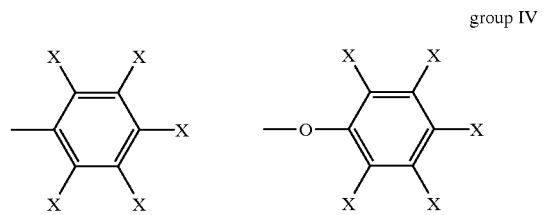

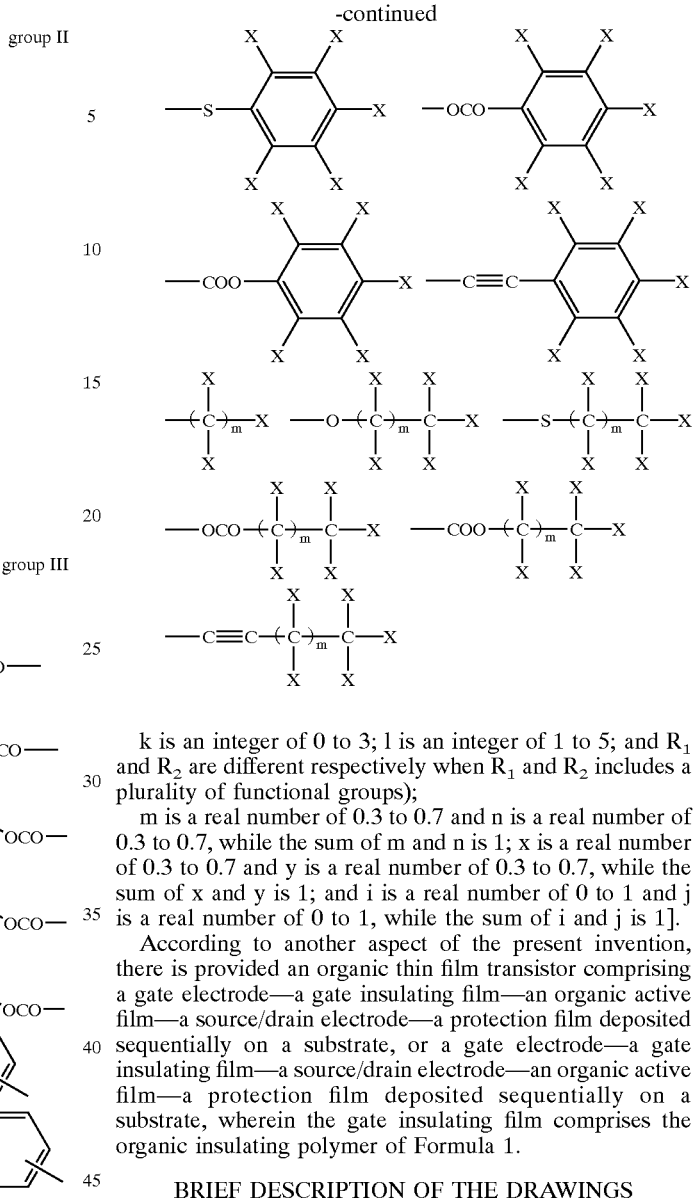

k is an integer of 0 to 3; l is an integer of 1 to 5; and $R_1$ and $R_2$ are different respectively when $R_1$ and $R_2$ includes a plurality of functional groups);

m is a real number of 0.3 to 0.7 and n is a real number of 0.3 to 0.7, while the sum of m and n is 1; x is a real number of 0.3 to 0.7 and y is a real number of 0.3 to 0.7, while the sum of x and y is 1; and i is a real number of 0 to 1 and j is a real number of 0 to 1, while the sum of i and j is 1].

According to another aspect of the present invention, there is provided an organic thin film transistor comprising a gate electrode—a gate insulating film—an organic active film—a source/drain electrode—a protection film deposited sequentially on a substrate, or a gate electrode—a gate insulating film—a source/drain electrode—an organic active film—a protection film deposited sequentially on a substrate, wherein the gate insulating film comprises the organic insulating polymer of Formula 1.

BRIEF DESCRIPTION OF THE DRAWINGS

These and other aspects and advantages of the invention will become apparent and more readily appreciated from the following description of the preferred embodiments, taken in conjunction with the accompanying drawings of which.

DETAILED DESCRIPTION OF THE INVENTION

Figure 1:
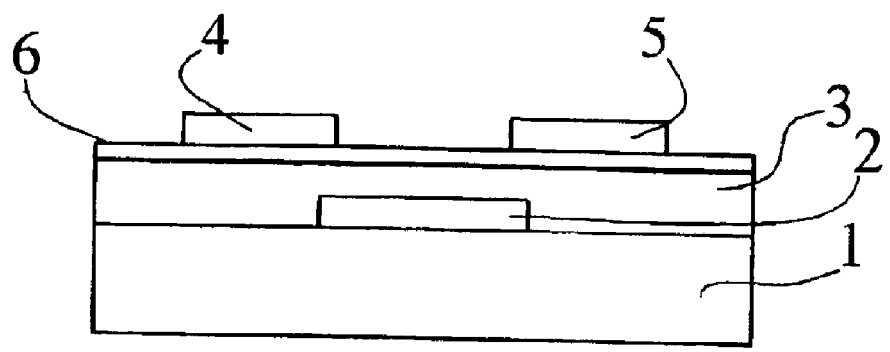
FIG. 1 illustrates a cross-sectional view of a transistor fabricated in Examples 1 to 5.

Based on the present invention, an organic gate insulating film includes an organic insulating polymer as represented by the following Formula 1:

Formula 1

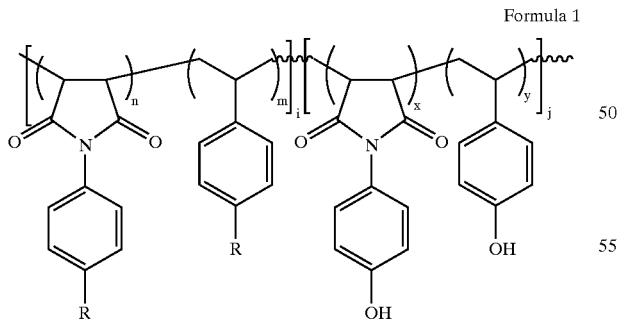

[Wherein, R is represented by the following Formula 2:

Formula 2

(Wherein, $R_1$ is selected from the following group I in which n is an integer of 0 to 10:

group I

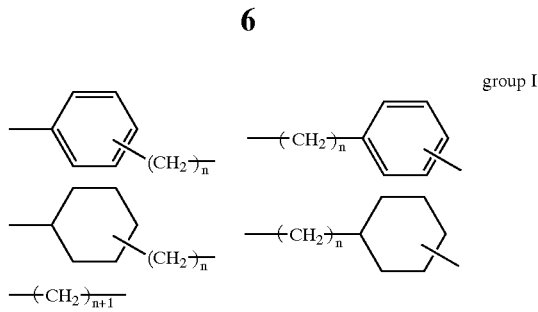

$R_2$ is a photo-alignment group selected from the groups II and III and, when 1 is 2 or more, at least one of $R_2$ is selected from the group II;

group II

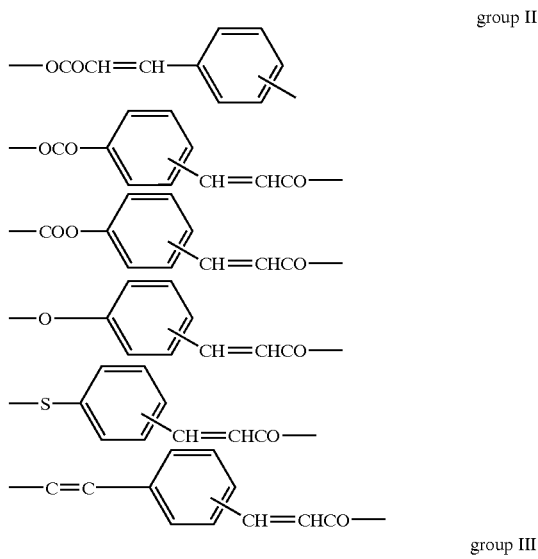

group III

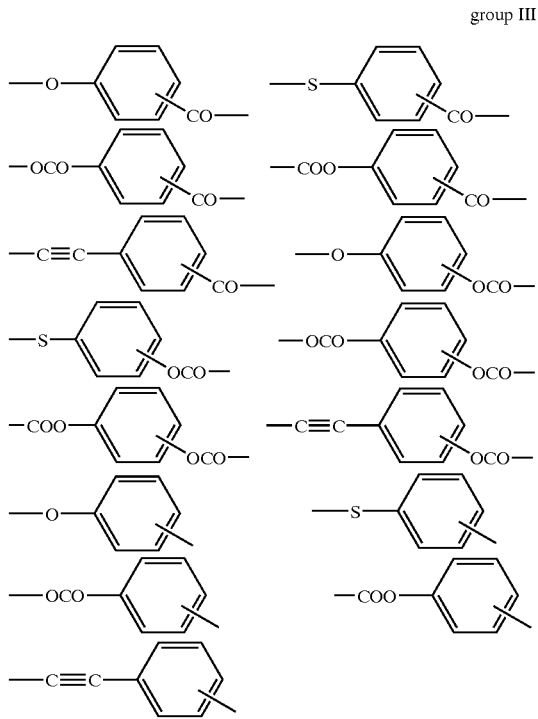

$R_3$ is a hydrogen atom or is selected from the group IV in which X shows a hydrogen atom, an alkyl or alkoxy group of 1 to 13 carbon atoms, an aromatic group of 6 to 20 carbon atoms, a heteroaromatic group of 4 to 14 carbon atoms having a heteroatom contained in an aromatic ring, $(OCH_2)_p CH_3$ (wherein p is an integer of 0 to 12), F, or Cl, and m is an integer of 0 to 18:

group IV

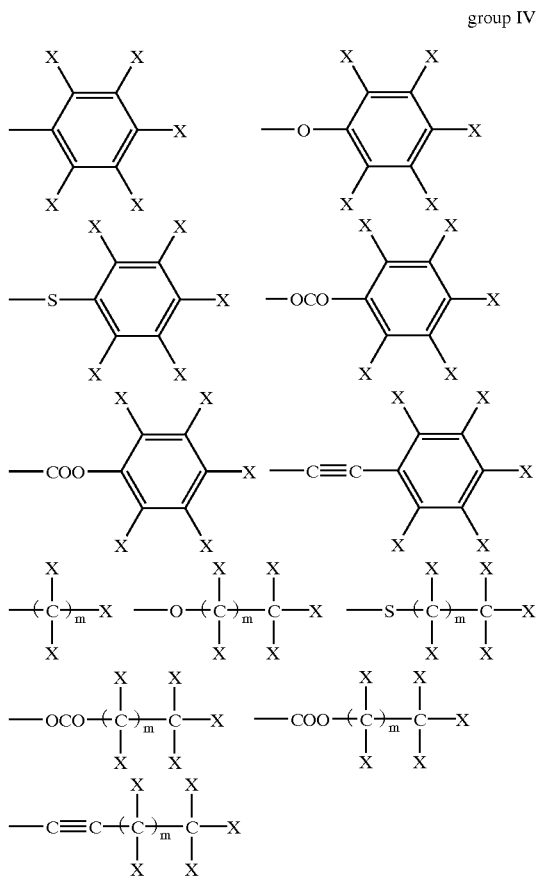

k is an integer of 0 to 3; l is an integer of 1 to 5; and $R_1$ and $R_2$ are different respectively when $R_1$ and $R_2$ includes a plurality of functional groups);

m is a real number of 0.3 to 0.7 and n is a real number of 0.3 to 0.7, while the sum of m and n is 1; x is a real number of 0.3 to 0.7 and y is a real number of 0.3 to 0.7, while the sum of x and y is 1; and i is a real number of 0 to 1 and j is a real number of 0 to 1, while the sum of i and j is 1].

The gate insulting film of the present invention is characterized in that a photo-alignment group is introduced into the organic insulating polymer used for the insulating film, so that alignment (or orientation) of an organic active film increase largely, thereby improving charge mobility. Also, by providing good condition for the formation of the organic active film, the organic insulating film of the present invention can contribute to obtain larger grain size in the organic active film, compared with the conventional inorganic insulating films.

These effects of the gate insulating films according to the present invention are believed to result from improving interface characteristics between the organic active film and the insulating film. In the present invention, the interfacial characteristics are determined by forming the assembly of organic insulating polymer layer and organic active layer and then measuring the surface energy of the interface therebetween, in accordance with the following equation:

$\Gamma s = \Gamma s^{LW} + \Gamma s^{AB}$ (Wherein, $\Gamma s$ is the total surface energy, and $\Gamma s^{LW}$ is the surface energy of a dispersion part, and $\Gamma s^{AB}$ is the surface energy of a polar part.)

The organic insulating polymer film of the present invention has the surface energy of 35 to 50 mN/m, and, judging from this, the surface energy is believed to have an effect on the grain size of organic active film by affecting the degree of crystallization when the organic active film being formed.

In Formula 1, the reason why the number ranges of m, n, x and y are defined as above is that the state of the thin film and characteristics of the transistor including the film can be improved dramatically when they fall in such ranges. Thin films can be fabricated even when m, n, x and y is out of the above ranges, but the state of the thin films obtained is in such a bad condition that it is very difficult to avoid deterioration in the characteristics of the transistors.

The organic thin film transistor of the present invention includes the organic insulating polymer as the insulating film, and is composed of, but not limited to, a generally known structure, that is, substrate/gate electrode/gate insulating film/organic active film/source-drain electrode or substrate/gate electrode/gate insulating film/source-drain electrode/organic active film.

The organic active film is formed of a generally used material, but not limited to, for example, pentacene, copper phthalocyanine, polythiophene, polyaniline, polyacetylene, polypyrrole polyphnylenevinylene or derivatives thereof.

The gate electrode is made of a generally used metal, but not limited to, for example, gold (Au), silver (Ag), nickel (Ni), indium tin oxide (ITO), aluminum (Al), chromium (Cr), etc.

The source and drain electrodes are made of a generally used metal, but being not limited to, for example, gold (Au), silver (Ag), nickel (ni), indium tin oxide (ITO), chromium (Cr), etc.

Having generally described this invention, a further understanding can be obtained by reference to specific examples that are provided hereinafter for the purposes of illustration only and are not intended to be limiting unless otherwise specified.

EXAMPLE 1

Fabrication of Organic Thin Film Transistor including Organic Insulating Polymer (S1) as Gate Insulating Film and Pentacene as Active Film An organic thin film transistor having a structure shown in FIG. 1 was fabricated by use of an organic insulating polymer (S1) represented by the following Formula Formula 7

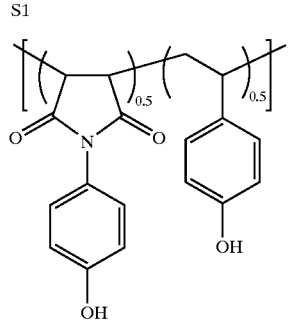

On a washed silicon substrate, a silicon oxide film was deposited at a thickness of 3000 Å with CVD (Chemical Vapor Deposition). Then, a 2000 Å thick gate electrode of aluminum (Al) was formed on the silicon oxide film using a method of vapor deposition. Thereafter, 10 wt % solution of organic insulating polymer (S1) dissolved in NMP was coated on the gate electrode by a spin coating process at 1000 rpm to obtain a thickness of 7000 Å, and then baked at 100° C. for 1 hour in a nitrogen atmosphere. Next, pentacene was deposited at a thickness of 700 Å under the conditions of a vacuum of $2 \times 10^{-6}$ torr, a substrate temperature of 80° C. and a deposition rate of 0.3 Å/sec, by OMBD (Organic Molecular Beam Deposition), thereby forming a pentacene active film on the organic insulating polymer film. Then, a source-drain electrode of gold (Au) was formed on the pentacene active film by vapor deposition, with using a shadow mask with a channel length of 100 μm and a channel width of 2 mm. Finally, organic thin film transistor of top contact type was fabricated as shown in FIG. 1.

In reference to FIG. 1, 1 denotes a substrate, 2 denotes a gate electrode, 3 denotes an organic gate insulating film, 4 denotes a source electrode, 5 denotes a drain electrode, 6 denotes an organic active film.

Figure 3:
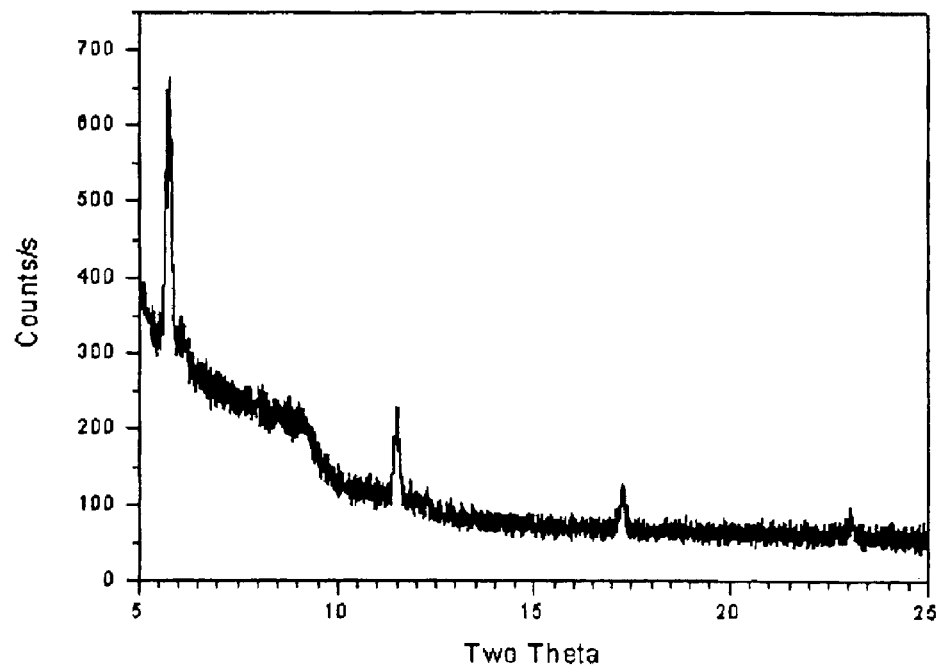
FIG. 3 illustrates an XRD graph of a pentacene thin film deposited onto an organic insulating film (S1) in Example 1.
Figure 4:
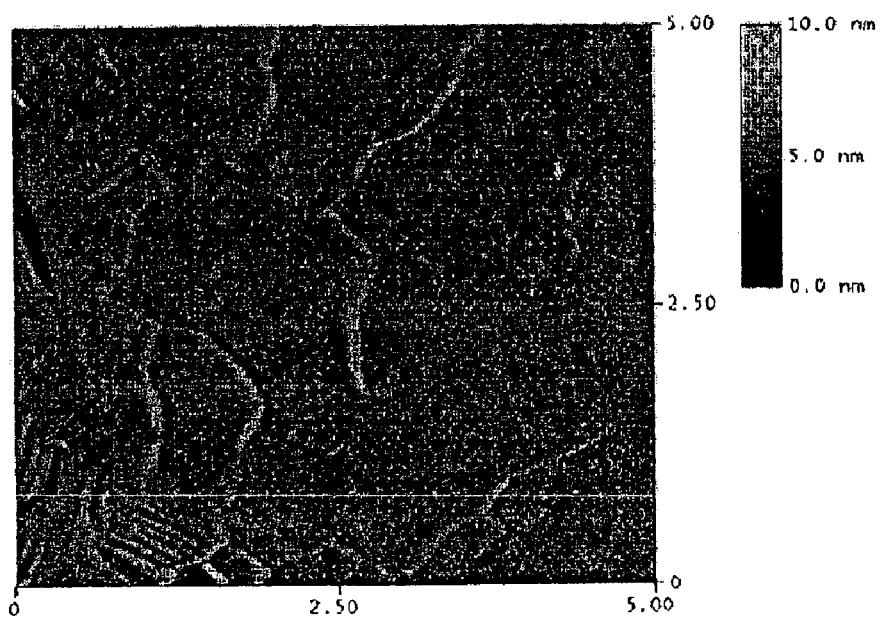
FIG. 4 illustrates an AFM (Atomic Force Microscope) image of the pentacene thin film deposited onto the organic insulating film (S1) in Example 1.
Figure 5:
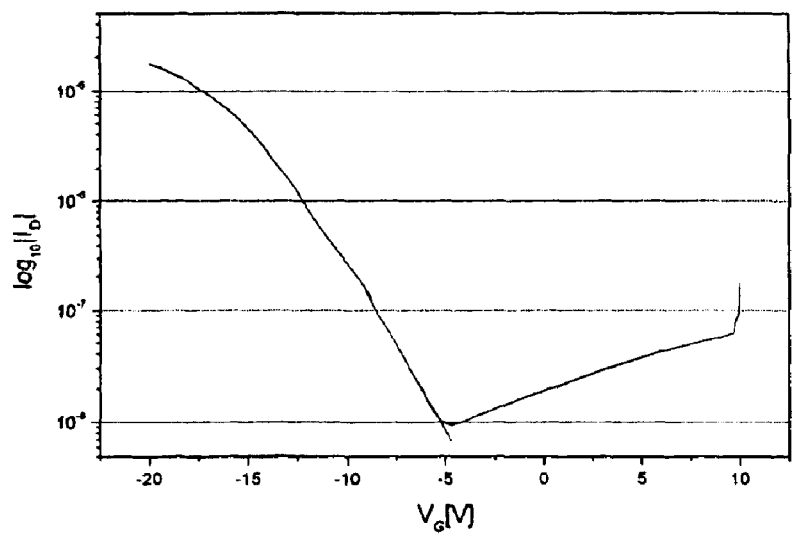
FIG. 5 illustrates a curve showing current transfer characteristics of an organic thin film transistor produced by Example 1.

An XRD graph of a pentacene thin film formed on the organic insulating polymer (S=b 1) is shown in FIG. 3, an AFM image thereof is seen in FIG. 4 and a current transfer curve of the fabricated organic thin film transistor is shown in FIG. 5:

XRD graph: measured using APD 1700 available from KRUSS Co. Ltd.

AFM image: measured using AutoProbe CP Research available from PSIA Co. Ltd.

Current transfer curve: measured using Semiconductor parameter analyzer HP4155A available from Hewlett Packard Co. Ltd.

EXAMPLE 2

Fabrication of Organic Thin Film Transistor including Organic Insulating Polymer (S2) as Gate Insulating Film and Pentacene as Active Film An organic thin film transistor having a structure shown in FIG. 1 was fabricated by use of an organic insulating polymer (S2) represented by the following Formula 8:

Formula 8

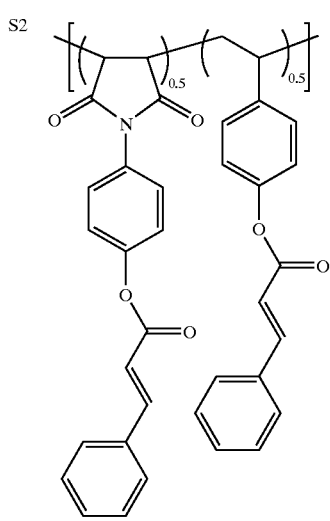

Except that 5 wt % solution of organic insulating polymer (S2) dissolved in NMP was coated on the gate electrode by a spin coating process at 2000 rpm to obtain a thickness of 2163 Å, then baked at 100° C. for 1 hour in a nitrogen atmosphere, and the film thus obtained was subject to UV-alignment with 350 nm UV having 1000 mJ, an organic thin film transistor was fabricated in the same way of Example 1.

Figure 6:
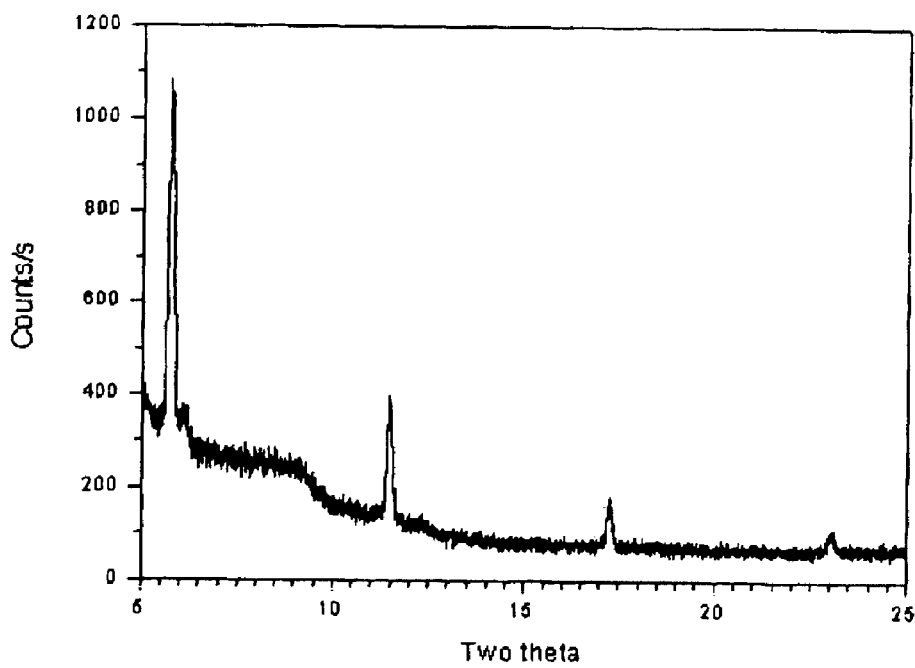
FIG. 6 illustrates an XRD graph of a pentacene thin film deposited onto an organic insulating film (S2) in Example 2.
Figure 7:
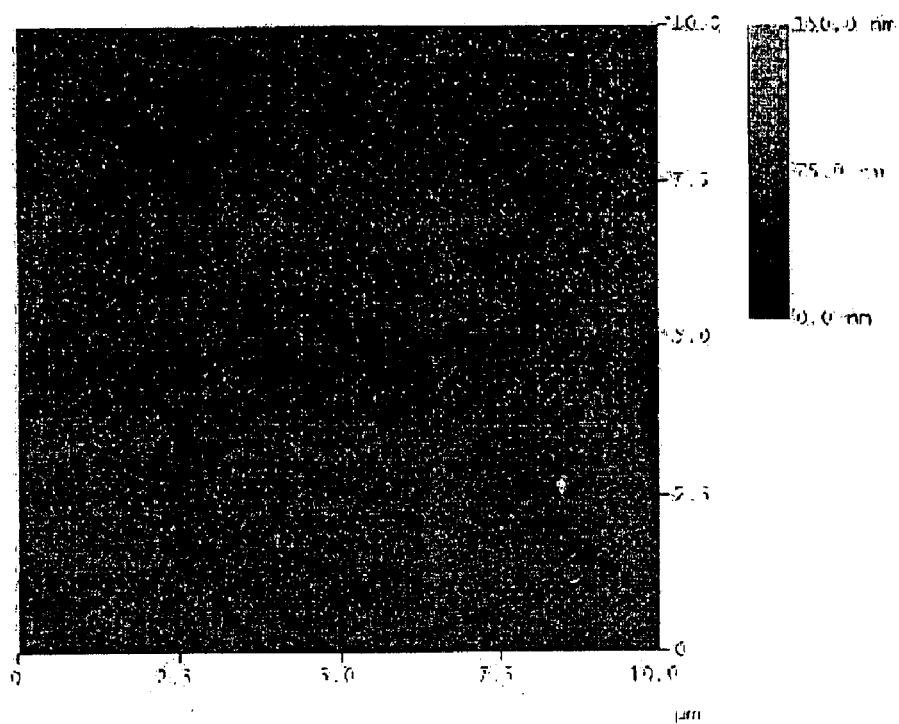
FIG. 7 illustrates an AFM image of the pentacene thin film deposited onto the organic insulating film (S2) in Example 2.
Figure 8:
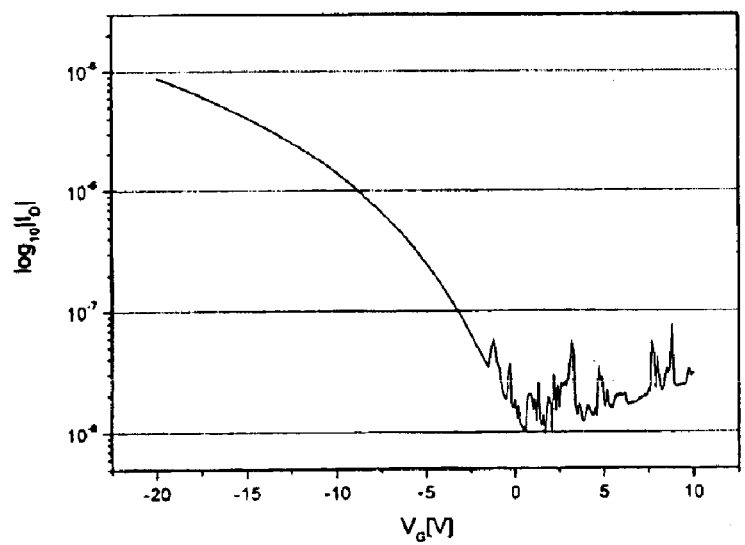
FIG. 8 illustrates a curve showing current transfer characteristics of an organic thin film transistor produced by Example 2.

An XRD graph of a pentacene thin film formed on the organic insulating polymer (S2) is shown in FIG. 6, an AFM image thereof is shown in FIG. 7, and a current transfer curve of the fabricated organic thin film transistor is shown in FIG. 8.

EXAMPLE 3

Fabrication of Organic Thin Film Transistor including Organic Insulating Polymer (S3) as Gate Insulating Film and Pentacene as Active Film An organic thin film transistor having a structure shown in FIG. 1 was fabricated by use of an organic insulating polymer (S3) represented by the following Formula 9:

Formula 9

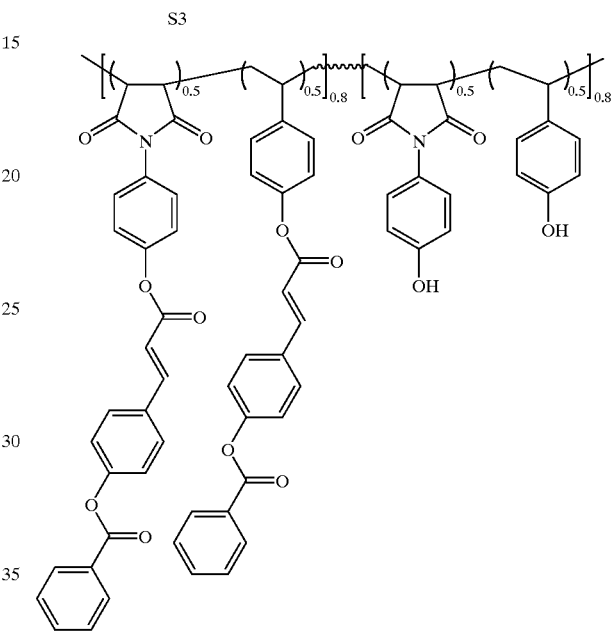

Except that 5 wt % solution of organic insulating polymer (S3) dissolved in NMP was coated on the gate electrode by a spin coating process at 1000 rpm to obtain a thickness of 3084 Å, then baked at 100° C. for 1 hour in a nitrogen atmosphere, and the film thus obtained was subject to UV-alignment with the same condition of Example 2, an organic thin film transistor was fabricated in the same way of Example 1.

Figure 9:
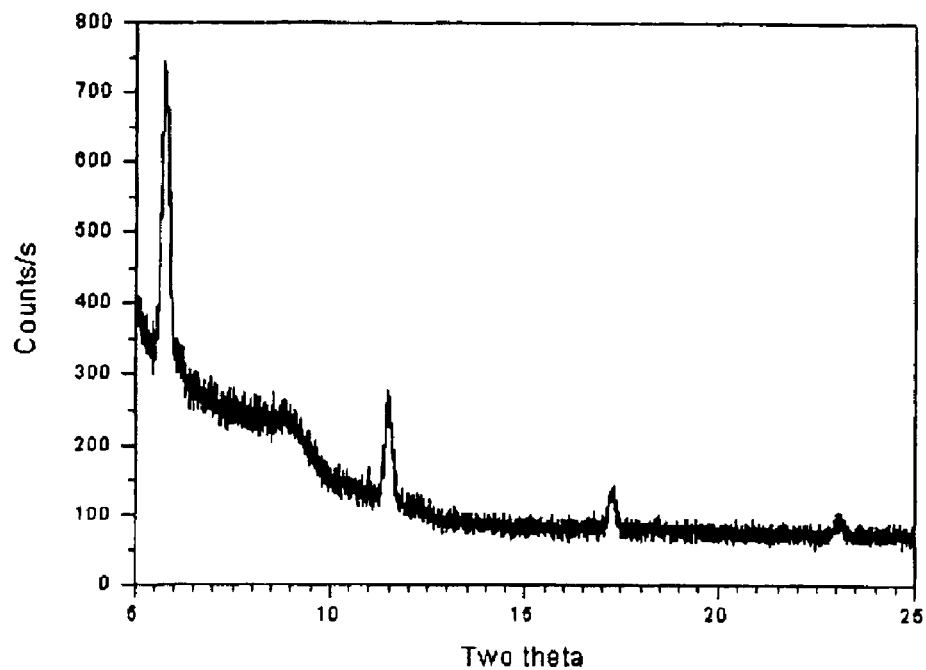
FIG. 9 illustrates an XRD graph of a pentacene thin film deposited onto an organic insulating film (S3) in example 3 of the present invention.
Figure 10:
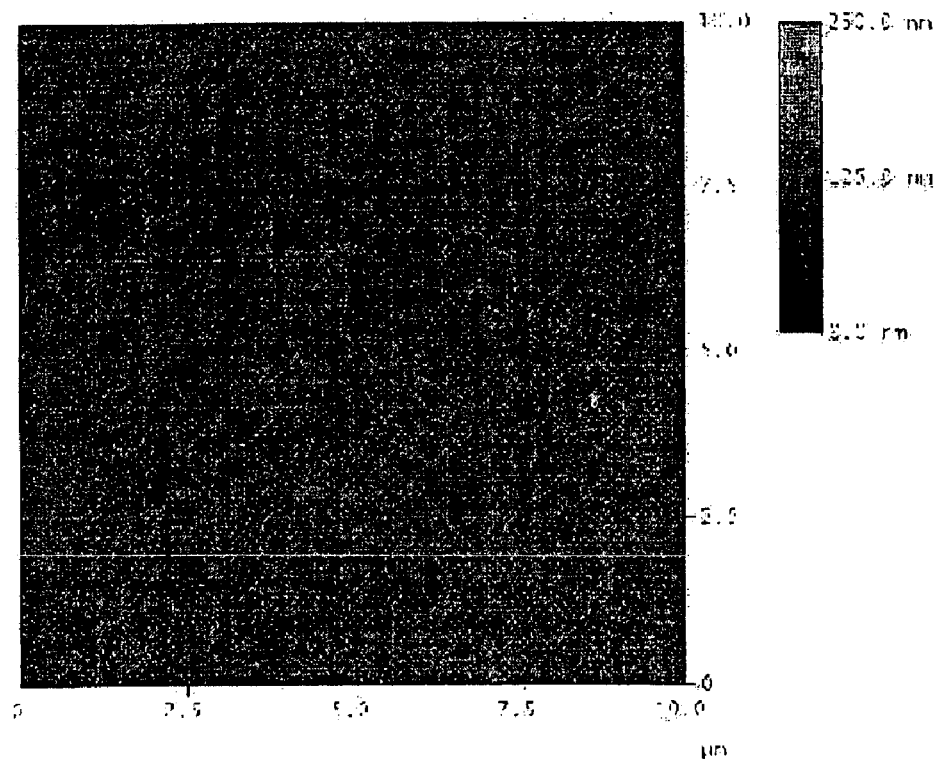
FIG. 10 illustrates an AFM image of the pentacene thin film deposited onto the organic insulating film (S3) in Example 3.
Figure 11:
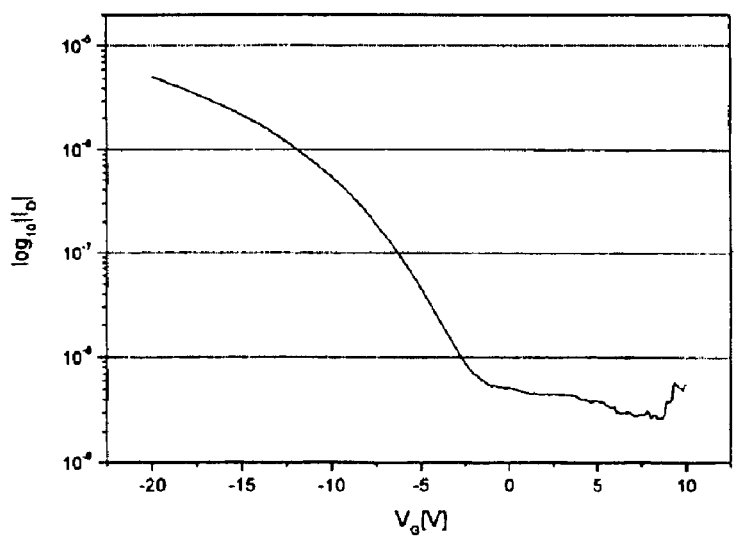
FIG. 11 illustrates a curve showing current transfer characteristics of an organic thin film transistor produced by Example 3.

An XRD graph of a pentacene thin film formed on the organic insulating polymer (S3) is shown in FIG. 9, an AFM image thereof is shown in FIG. 10, and a current transfer curve of the fabricated organic thin film transistor is shown in FIG. 11.

EXAMPLE 4

Fabrication of Organic Thin Film Transistor including Organic Insulating Polymer (S4) as Gate Insulating Film and Pentacene as Active Film An organic thin film transistor having a structure shown in FIG. 1 was fabricated by use of an organic insulating polymer (S4) represented by the following Formula 10:

Formula 10

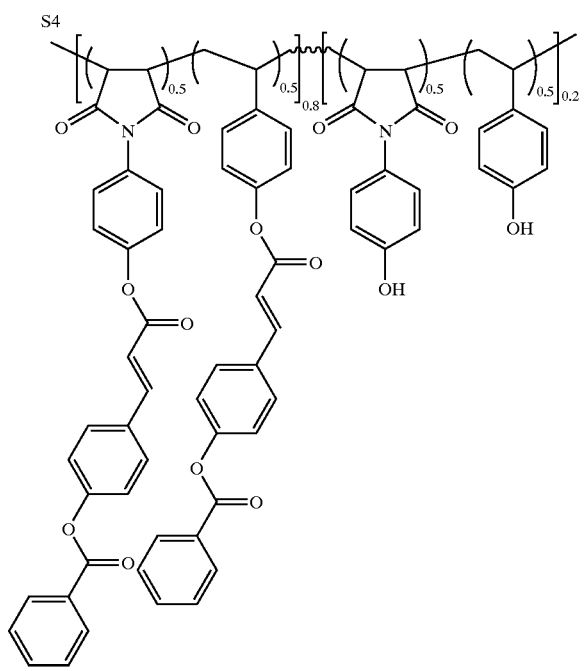

S4

Except that 5 wt % solution of organic insulating polymer (S4) dissolved in NMP was coated on the gate electrode by a spin coating process at 1000 rpm to obtain a thickness of 2900 Å, then baked at 100° C. for 1 hour in a nitrogen atmosphere, and the film thus obtained was subject to UV-alignment with the same condition of Example 2, an organic thin film transistor was fabricated in the same way of Example 1.

Figure 12:
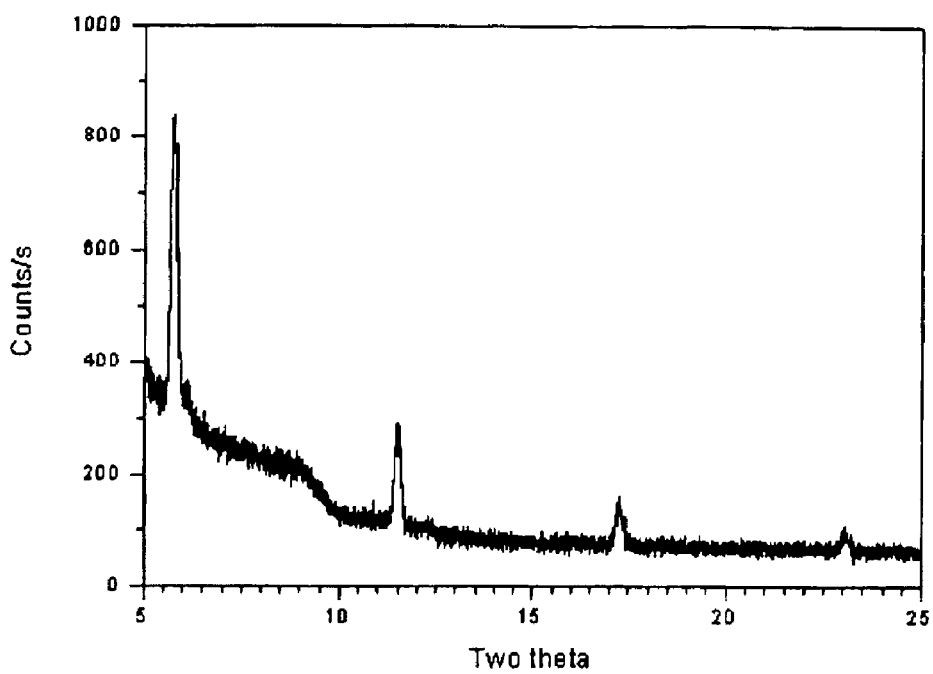
FIG. 12 illustrates an XRD graph of a pentacene thin film deposited onto an organic insulating film (S4) in Example 4.
Figure 13:
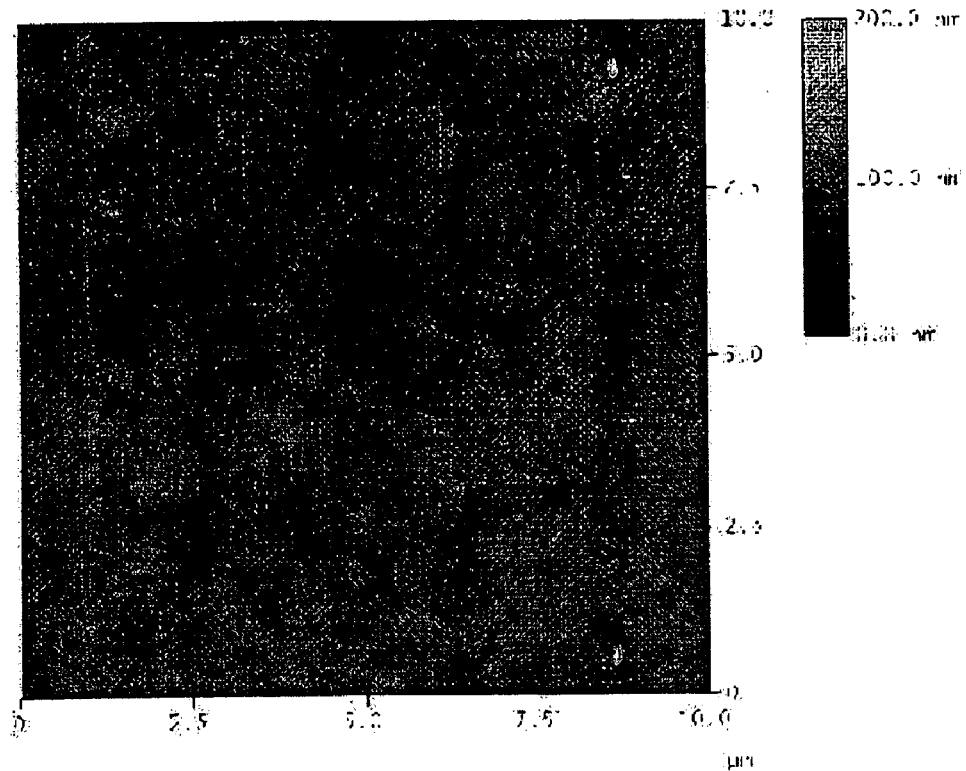
FIG. 13 illustrates an AFM image of the pentacene thin film deposited onto the organic insulating film (S4) in Example 4.
Figure 14:
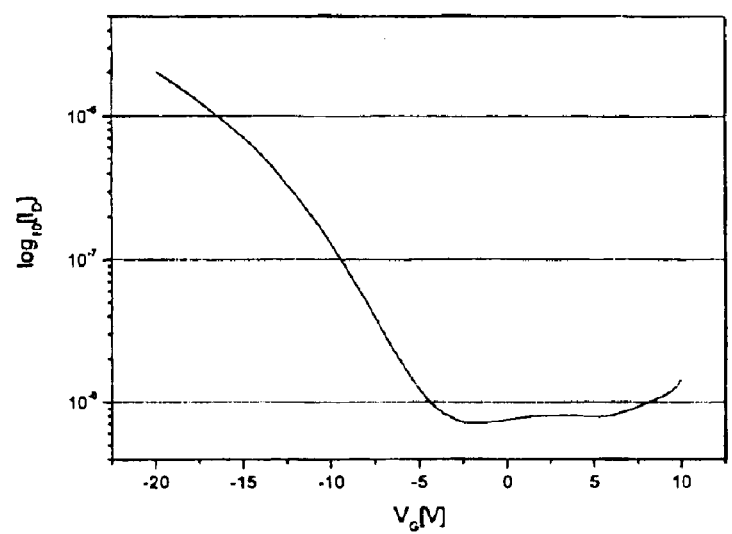
FIG. 14 illustrates a curve showing current transfer characteristics of an organic thin film transistor produced by Example 4.
Figure 15:
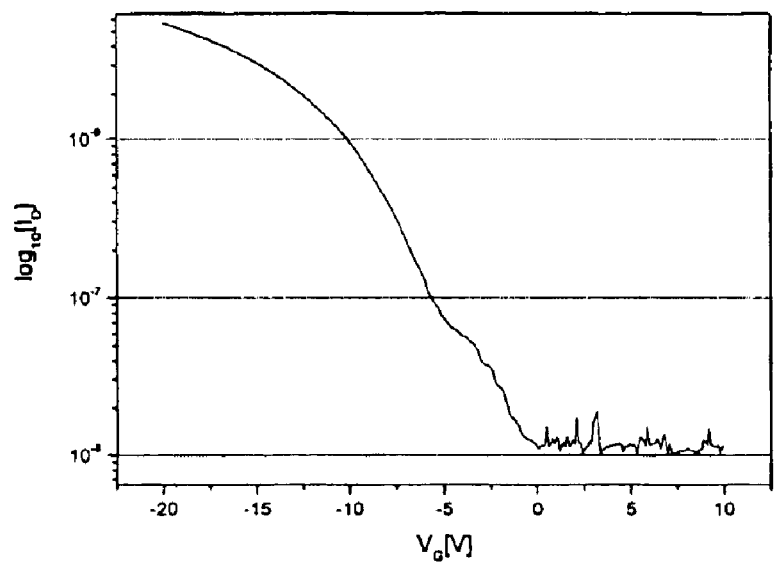
FIG. 15 illustrates a curve showing current transfer characteristics of an organic thin film transistor in Example 5.

An XRD graph of a pentacene thin film formed on the organic insulating polymer (S4) is shown in FIG. 12, an AFM image thereof is shown in FIG. 13, and a current transfer curve of the fabricated organic thin film transistor is shown in FIG. 14.

EXAMPLE 5
Fabrication of Organic Thin Film Transistor including Organic Insulating Polymer (S1) as Gate Insulating Film and P3HT of Conductive Polymer as Active Film Except that a conductive polymer other than pentacene was used as an active film, an organic thin film transistor was fabricated in the same way of Example 1. Specifically, 5 wt % solution of the conductive polymer, Poly(3hexylthiopene-2,5-diyl)[P3HT], dissolved in chloroform was coated by a spin coating process at 2000 rpm to obtain a thickness of 2160 Å, and then baked at 100° C. for 1 hour in a nitrogen atmosphere to form a organic active layer. The P3HT was purchased from Aldrich co. Ltd and subjected to further purification before use.

Comparing the XRD peaks of the pentacene thin film fabricated in Examples 1 to 5 with known data (Journal of Non-Crystalline Solids 299–302, 2002, pp. 1042–1046), it can be found that the pentacene thin film of the present invention can be successfully fabricated. Further, the pentacene thin film as the organic active film deposited on the organic insulating film has a grain size of about 2 to 3 μm, which is two to three times larger than 1 μm, a grain size of a thin film obtained by treating the surface of an inorganic thin film with self-assembly materials, OctadecylTrichloroSilane (hereinafter, OTS). (see: Jpn. *J. Appl. Phys. Vol.* 41 (2002) pp. 2730–2734)

Figure 2:
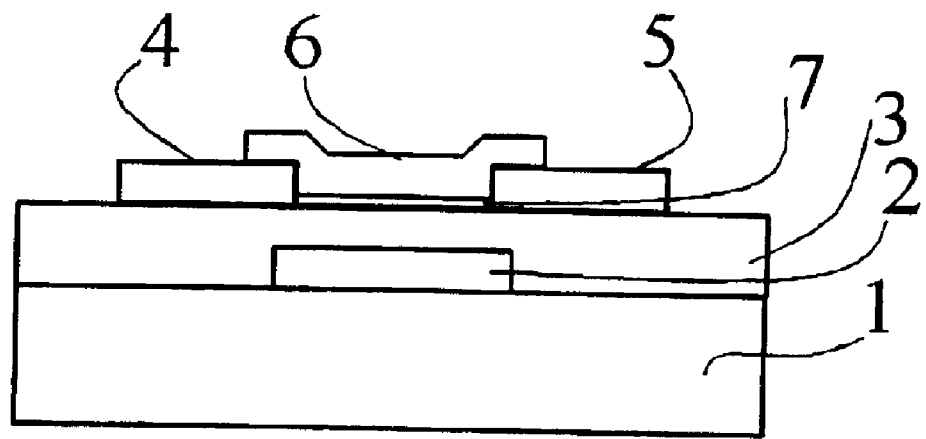
FIG. 2 illustrates a cross-sectional view of a transistor fabricated in comparative Examples 1 to 3.

Comparative Example 1
Fabrication of Organic Thin Film Transistor including $SiO_2$ as Gate Insulating Film and Pentacene as Active Film Organic thin film transistor of bottom contact type as shown in FIG. 2 was fabricated (without OTS film). A surface of a Si wafer substrate was treated by RCA washing process, a wet-chemical washing process widely used for a semiconductor process. The substrate was high-level doped p+-Si, and a doped Si was used as a gate. By a thermal oxidation process, a 992 Å-thick $SiO_2$ layer was grown on the substrate and then washed with the RCA process. Thereafter, a baking process accompanying dehydration was performed at 100° C. for 15 min. In order for the doped silicon substrate to be used as a gate, $SiO_2$ was partially etched according to the following procedures: First, hexamethyldisilazane was coated on a $SiO_2$ substrate with a spin-coater (RAURELL, WS-400-6NPP) at 3000 rpm for 10 sec and a photoresist (Positive PR Az 1512) was coated thereon at 2000 rpm for 15 sec and then subjected to a soft-baking at 100° C. for 15 min. For partial etching, an exposing process was performed for 40 sec through an optical mask for use in the formation of partially etched windows by use of a mask aligner (Karlsuss, MJB 3), after which a developing process was carried out using a developer (AZ 300 MIF Developer, Clariant). Then, the developer remaining on the substrate was eliminated by using deionized water and residual moisture thereon was removed by $N_2$ gas, and then a hard-baking process was performed at 100° C. for 15 min. Further, based on the fact that BHF (buffered HF) mixed with $NH_4F$ can be used for a control of an etching rate of $SiO_2$, 50% solution of a mixture of HF, deionized water and $NH_4F$ at a ratio of 1:3:3 was prepared and used for etching an oxide film thereby a gate was formed.

In addition, the photoresist was coated again and a baked to form source-drain patterns through a lift-off process. As the source-drain electrode, Au was used because it is known to be easily deposited with thermal deposition and to have a high work function of 5.1 eV.

Then, a 700 Å thick pentacene film was deposited onto a device on which source-drain formed through OMBD method, under the conditions of a vacuum of $2 \times 10^{-6}$ torr, a substrate temperature of 80° C. and a deposition rate of 0.3 Å/sec by using a shadow mask with a channel length of 10 μm and a channel width of 2 mm. The organic thin film transistor thus obtained had an invert-coplanar structure as shown in FIG. 2. In the invert-coplanar structure, the gate electrode was positioned on an opposite side of the source and drain electrodes on which the pentacene active film was deposited. Commercially available pentacene powders (Aldrich Co. Ltd., 99.8%) were used without further purification.

In reference to FIGS. 2, 3 denotes gate insulating film of $SiO_2$.

Figure 16:
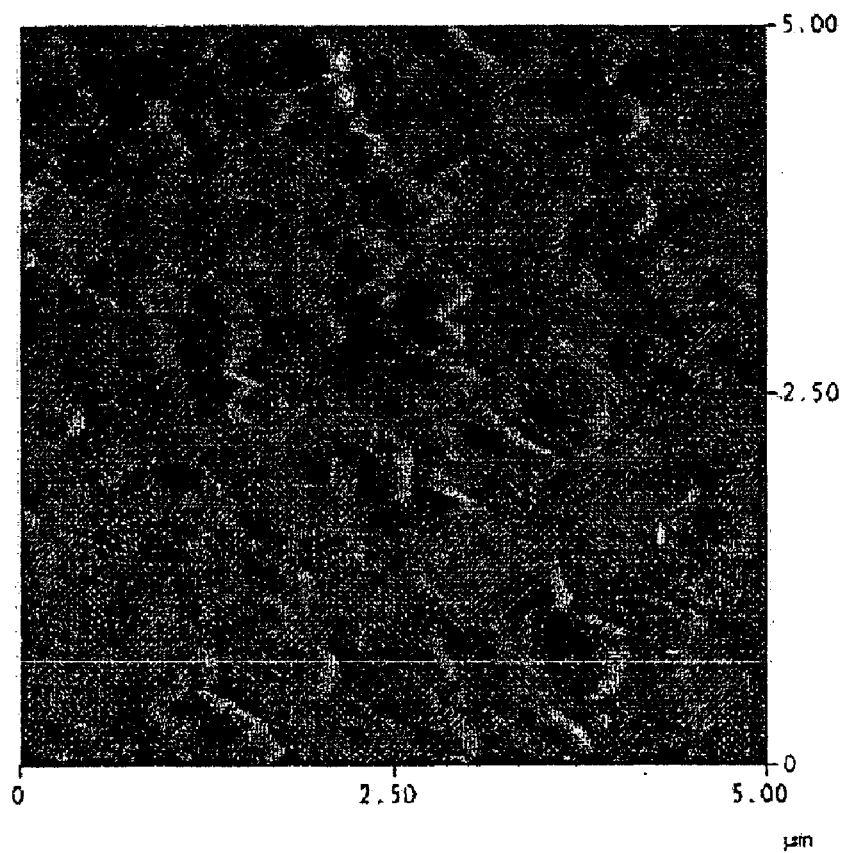
FIG. 16 illustrates an AFM image of a pentacene thin film deposited onto $SiO_2$ in Comparative Example 1.
Figure 17:
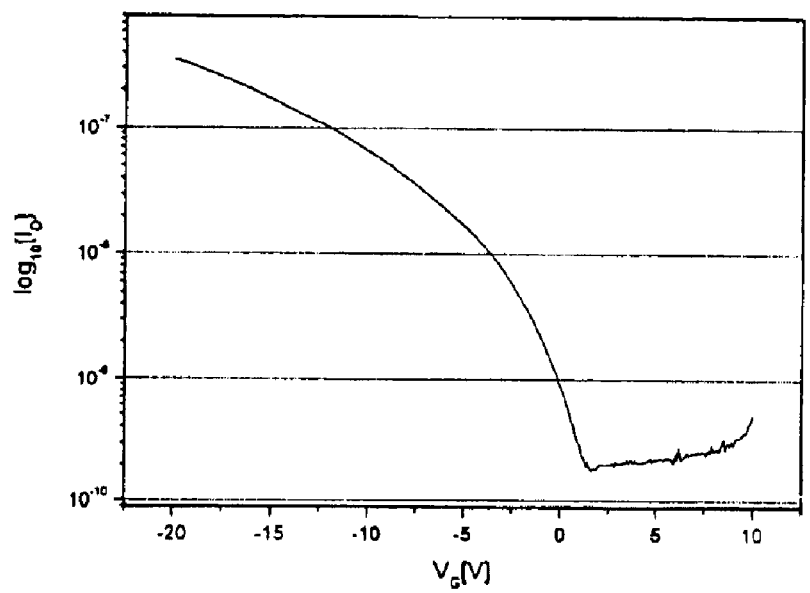
FIG. 17 illustrates a curve showing current transfer characteristics of an organic thin film transistor in Comparative Example 1.

The AFM image of the pentacene thin film is shown in FIG. 16, and the current transfer curve of the fabricated organic thin film transistor is seen in FIG. 17.

Comparative Example 2
Fabrication of Organic Thin Film Transistor including OTS-Surface Treated $SiO_2$ as Gate Insulating Film and Pentacene as Active Film With the exception that an OTS film was formed on the $SiO_2$ oxide film by use of a self-organizing method in which a substrate having a source/drain electrode was immersed for 24 hours in a 0.1M OTS solution diluted with chloroform, a thin film transistor was manufactured in the same manner as in Comparative Example 1. In reference to FIGS. 2, 7 denotes self-assembly material (OTS) layer.

Figure 18:
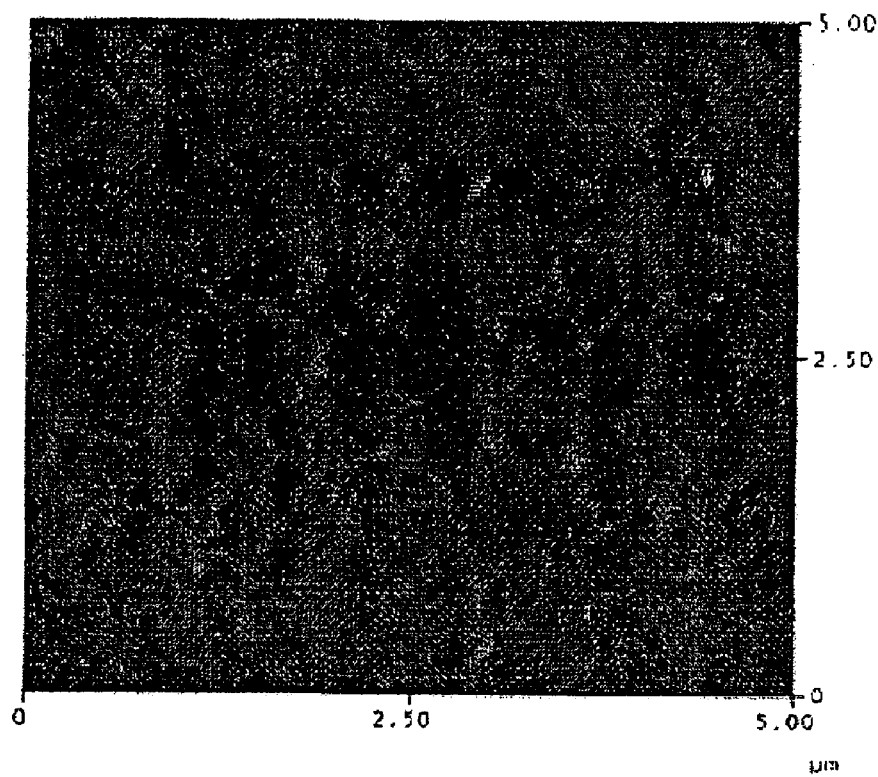
FIG. 18 illustrates an AFM image of a pentacene thin film deposited onto OTS-treated $SiO_2$ in comparative example 2 of the present invention.
Figure 19:
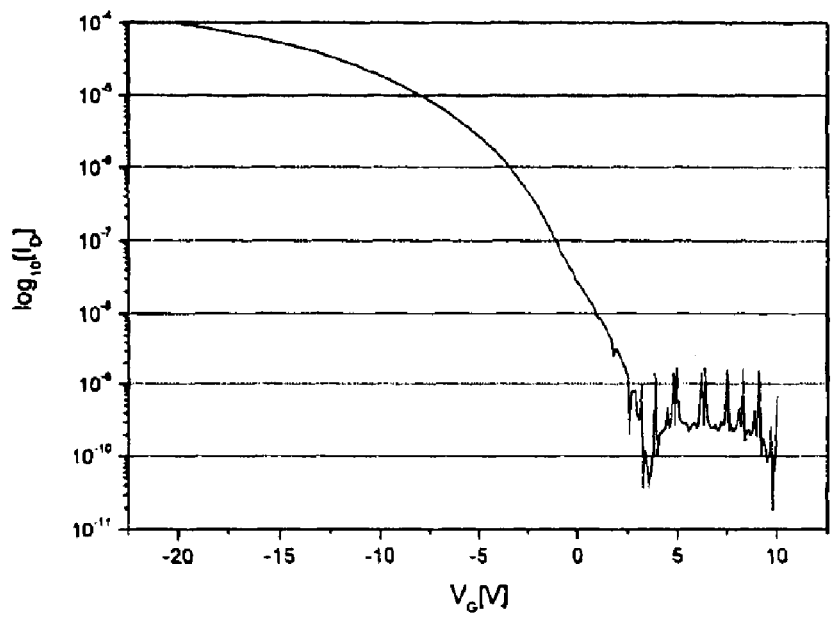
FIG. 19 illustrates a curve showing current transfer characteristics of an organic thin film transistor in Comparative Example 2.

The AFM image of the fabricated pentacene thin film is shown in FIG. 18, and the current transfer curve of the fabricated transistor is shown in FIG. 19.

Comparative Example 3

Fabrication of Organic Thin Film Transistor including OTS-Surface Treated $SiO_2$ as Gate Insulating Film and Conductive Polymer P3HT as Active Film Except that a conductive polymer, i.e. P3HT was used as an active film, an organic thin film transistor was fabricated in the same way of Comparative Example 2. Specifically, 1 wt % solution of P3HT dissolved in chloroform was coated by a spin coating process at 2000 rpm to obtain a thickness of 2160 Å, and then baked at 100° C. for 1 hour in a nitrogen atmosphere to form a organic active layer.

Figure 20:
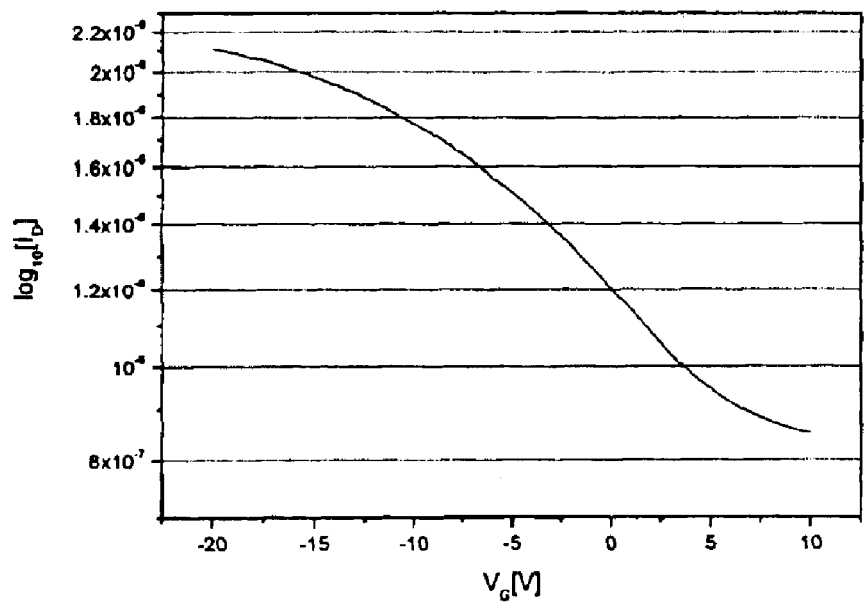
FIG. 20 illustrates a curve showing current transfer characteristics measured by use of an organic thin film transistor in Comparative Example 3.

The current transfer curve of the fabricated organic thin film transistor is shown in FIG. 20.

[Measurement of Physical Properties]

(1) Measurement of Surface Energy of Gate Insulating Films

By using Test pieces prepared from thin films of the organic insulating polymers (S1, S2, S3, and S4), the $SiO_2$ thin film and the OTS-treated thin film of $SiO_2$, surface energy was measured with a drop shape analysis system, DSA 10 MK2 of KRUSS Co. Ltd.

After setting the temperature at 25° C., each of test pieces was placed on a stage. Deionized water, diiodomethane and formamide were separately injected into three syringes, one of which was positioned upward to be perpendicular to the test piece. Then, a distance and a focus of a microscope were adjusted and the stage was controlled right and left in order for a tip of a needle of the syringe to be seen along with the test piece in the monitor. The liquid in the syringe was added dropwise on the stage. After 10 sec, a baseline was adjusted and a contact angle was measured. The other two liquids were measured for contact angles in the same manner. The contact angles measured using the three liquids were analyzed with an analytic program (Drop shape analysis (DSA), ver. 1.70.0.81, KRUSS), to calculate the surface energy. Thusly determined surface energy is shown in Table 1, below.

(2) Evaluation of Electrical Characteristics of Organic Thin Film Transistors

Using the transistors fabricated in Examples 1 to 5 and Comparative Examples 1 to 3, charge mobility for each transistor was measured. The charge mobility was calculated by the following current equation of saturation region, with using the curves showing the current transfer characteristics measured by a semiconductor parameter analyzer (HP4155A) available from Hewlett Packard Co. Ltd.:

$$I_{SD} = \frac{WC_O}{2L}\mu(V_G - V_T)^2 \quad (1)$$

The above equation (1) was converted to the equation (2) and a graph of $V_G$ and $(I_{SD})^{1/2}$ was plotted. In reference to the following equations, a slope of the converted graph was obtained to calculate the charge mobility:

$$\sqrt{I_{SD}} = \sqrt{\frac{\mu C_O W}{2L}}(V_G - V_T) \quad (2)$$

$$\text{slope} = \sqrt{\frac{\mu C_O W}{2L}}$$

$$\mu_{FET} = (\text{Slope})^2 \Delta \frac{2L}{C_O W}$$

$I_{SD}$: source-drain current, $\mu_{FET}$: charge mobility, $C_O$: oxide film capacity, W: channel width, L: channel length, $V_G$: gate voltage, $V_T$: threshold voltage (3) Measurement of Grain Sizes The grain sizes were determined by averaging the values obtained with reference to the scales shown in the AFM images of the pentacene thin films deposited on the organic insulating films.

TABLE 1

| Ex. No. | Gate Insul. Film | Active film | Surface Energy of Insul. Film (mN/m) | Mobility (cm²/Vs) | Grain size |
|---|---|---|---|---|---|
| 1 | S1 | Pentacene | 46.1 | 1.80 | ~2.5 |
| 2 | S2 | Pentacene | 38.3 | 0.33 | ~2.5 |
| 3 | S3 | Pentacene | 38.6 | 0.22 | ~2 |
| 4 | S4 | Pentacene | 38.3 | 0.43 | ~2 |
| C. 1 | $SiO_2$ | Pentacene | 57.0 | 0.01 | >1 |
| C. 2 | $SiO_2$ (OTS) | Pentacene | 37.1 | 0.3 | ~1 |
| 5 | S1 | P3HT | 46.1 | 0.6 | — |
| C. 3 | $SiO_2$ (OTS) | P3HT | 37.1 | 0.01 | — |

From Table 1, it can be seen that the use of the organic insulating polymer of the present invention results in a drastic increase in mobility, regardless of the active film material. In particular, the surface energy of the organic insulating film has an influence on such an increase.

As described above, the present invention provides an organic gate insulating film and an organic thin film transistor fabricated using the same. In such a transistor, the organic active film formed on the organic insulating film has larger grain sizes, compared to that of an organic active film formed on a conventional inorganic insulating film. Further, the transistor of the present invention has very high mobility.

The present invention has been described in an illustrative manner, and it should be understood that the terminology used is intended to be in the nature of description rather than of limitation. Many modifications and variations of the present invention are possible in light of the above teachings. Therefore, it should be understood that within the scope of the appended claims, the invention may be practiced otherwise than as specifically described.

What is claimed is:

1. An organic gate insulating film comprising the organic insulating polymer as represented by the following Formula 1:

Formula 1

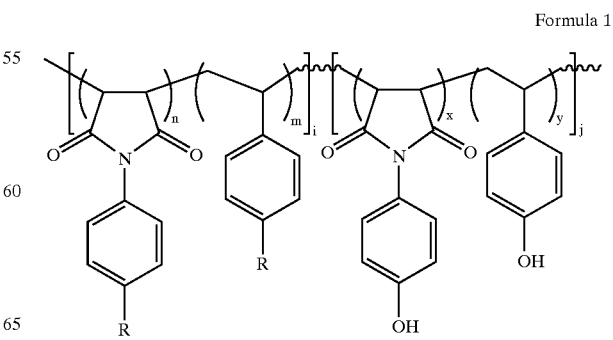

[Wherein, R is represented by the following Formula 2:

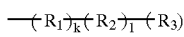

Formula 2

(Wherein, $R_1$ is selected from the following group I in which n is an integer of 0 to 10:

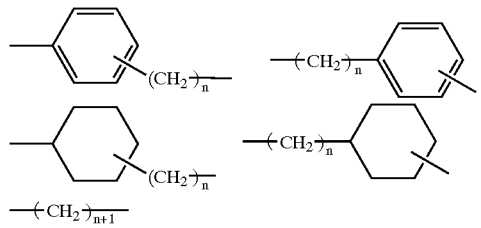

group I $R_2$ is a photo-alignment group selected from the groups II and III and, when l is 2 or more, at least one of $R_2$ is selected from the group II;

group II

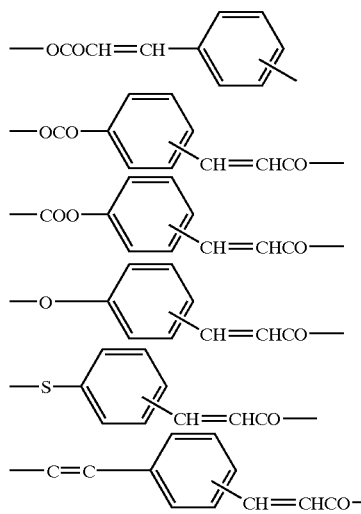

group III

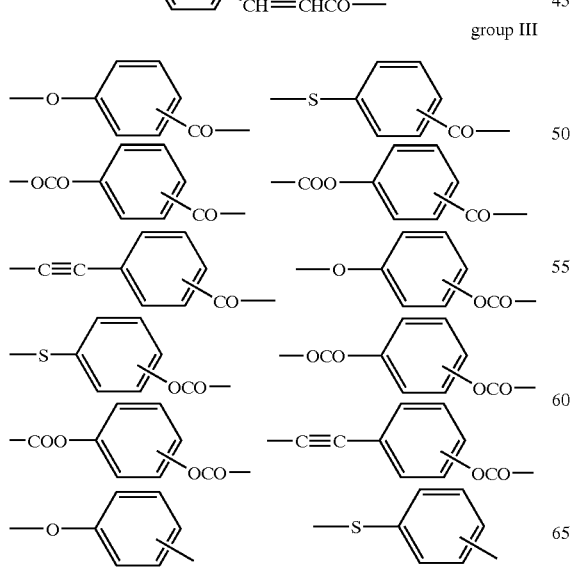

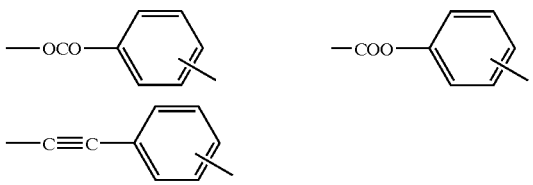

$R_3$ is a hydrogen atom or is selected from the group IV in which X shows a hydrogen atom, an alkyl or alkoxy group of 1 to 13 carbon atoms, an aromatic group of 6 to 20 carbon atoms, a heteroaromatic group of 4 to 14 carbon atoms having a heteroatom contained in an aromatic ring, $(OCH_2)_p CH_3$ (wherein p is an integer of 0 to 12), F, or Cl, and m is an integer of 0 to 18:

group IV

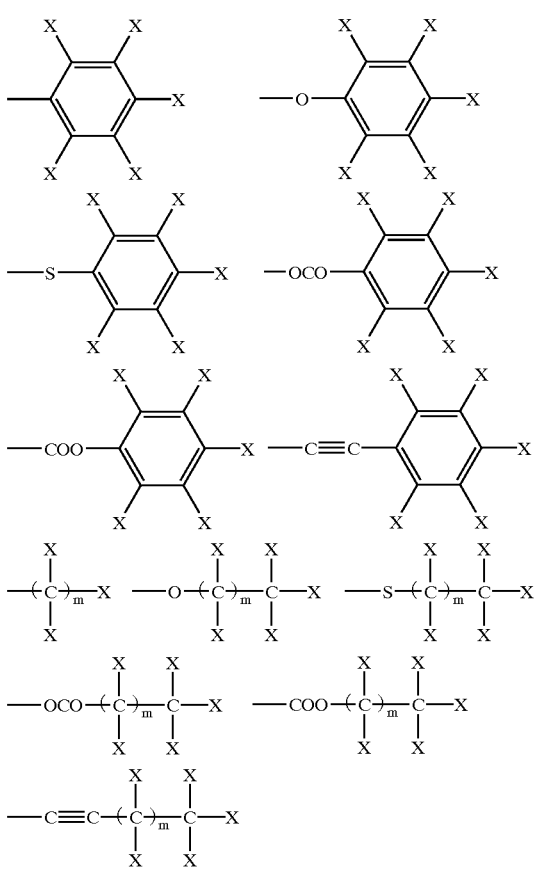

k is an integer of 0 to 3; l is an integer of 1 to 5; and $R_1$ and $R_2$ are different respectively when $R_1$ and $R_2$ includes a plurality of functional groups);

m is a real number of 0.3 to 0.7 and n is a real number of 0.3 to 0.7, while the sum of m and n is 1; x is a real number of 0.3 to 0.7 and y is a real number of 0.3 to 0.7, while the sum of x and y is 1; and i is a real number of 0 to 1 and j is a real number of 0 to 1, while the sum of i and j is 1].

2. The organic gate insulating film of claim 1, wherein the organic insulating polymer is represented by Formula 11:

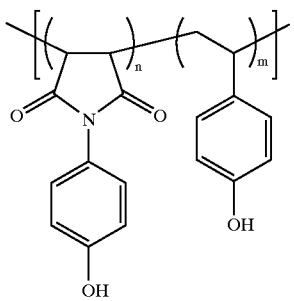

Formula 11

(wherein, m is a real number of 0.3 to 0.7, n is a real number of 0.3 to 0.7, and m+n is 1).

3. An organic Thin Film Transistor formed by laminating, sequentially on a substrate, a gate electrode, a gate insulating film, an organic active film, a source/drain electrode and a protection film, or laminating, sequentially on a substrate, a gate electrode, a gate insulating film, a source/drain electrode, an organic active film and a protection film, wherein the gate insulating film is the one set forth in claim 1.

4. The organic Thin Film Transistor of claim 3, wherein the organic gate insulating film is formed by printing, spin coating or dip coating.

5. The organic Thin Film Transistor of claim 3, wherein the organic active film is selected from the group consisting of pentacene, copper phthalocyanine, polythiophene, polyaniline, polyacetylene, polypyrrole, polyphenylenevinylene, and derivatives thereof.

6. The organic Thin Film Transistor of claim 3, wherein the gate electrode is made of gold (Au), silver (Ag), nickel (Ni), indium tin oxide (ITO), aluminum (Al), or chromium (Cr) and the source and drain electrodes are made of gold (Au), silver (Ag), nickel (ni), indium tin oxide (ITO), or chromium (Cr).

* * * * *